(12) United States Patent
Yang

(10) Patent No.: US 11,387,412 B2
(45) Date of Patent: Jul. 12, 2022

(54) RESISTIVE MEMORY DEVICE AND MANUFACTURING METHOD THEREOF

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/024,680

(22) Filed: Sep. 17, 2020

(65) Prior Publication Data

US 2022/0059762 A1 Feb. 24, 2022

(30) Foreign Application Priority Data

Aug. 19, 2020 (CN) .......................... 202010835984.0

(51) Int. Cl.
*H01L 45/00* (2006.01)
(52) U.S. Cl.
CPC ...... *H01L 45/1253* (2013.01); *H01L 45/1233* (2013.01); *H01L 45/1608* (2013.01); *H01L 45/1675* (2013.01)
(58) Field of Classification Search
CPC .................. H01L 45/1253; H01L 45/1608
See application file for complete search history.

(56) References Cited

U.S. PATENT DOCUMENTS

| | | | |
|---|---|---|---|
| 7,561,460 B2 | 7/2009 | Liaw | |
| 7,989,791 B2 | 8/2011 | Kang | |
| 8,000,128 B2 | 8/2011 | Li | |
| 8,169,053 B2 | 5/2012 | Kim | |
| 8,278,640 B2 | 10/2012 | Lee | |
| 2020/0321398 A1* | 10/2020 | Ko | H01L 45/1233 |

* cited by examiner

*Primary Examiner* — Mounir S Amer
(74) *Attorney, Agent, or Firm* — Winston Hsu

(57) ABSTRACT

A resistive memory device includes a first stacked structure and a second stacked structure. The first stacked structure includes a first bottom electrode, a first top electrode disposed on the first bottom electrode, and a first variable resistance layer disposed between the first bottom electrode and the first top electrode in a vertical direction. The second stacked structure includes a second bottom electrode, a second top electrode disposed on the second bottom electrode, and a second variable resistance layer disposed between the second bottom electrode and the second top electrode in the vertical direction. A thickness of the first variable resistance layer is less than a thickness of the second variable resistance layer for increasing the number of switchable resistance states of the resistive memory device.

17 Claims, 15 Drawing Sheets

RESISTIVE MEMORY DEVICE AND MANUFACTURING METHOD THEREOF

BACKGROUND OF THE INVENTION

1. Field of the Invention

The present invention relates to a resistive memory device and a manufacturing method thereof, and more particularly, to a resistive memory device including variable resistance layers with different thicknesses and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The volatile memory device is a computer memory that loses its stored data when power to the operation is interrupted. Comparatively, in the non-volatile memory device, the stored data will not be lost when the power supply is interrupted. The resistive random access memory (RRAM) is a kind of non-volatile memory technology having the characteristics of low operating voltage, low power consumption, and high writing speed and is regarded as a memory structure that can be applied to many electronic devices.

SUMMARY OF THE INVENTION

A resistive memory device and a manufacturing method thereof are provided in the present invention. Variable resistance layers with different thicknesses are used to increase the number of switchable resistance states of the resistive memory device, and the resistive memory device with multiple resistance states may be realized accordingly.

According to an embodiment of the present invention, a resistive memory device is provided. The resistive memory device includes a first stacked structure and a second stacked structure. The first stacked structure includes a first bottom electrode, a first top electrode, and a first variable resistance layer. The first top electrode is disposed on the first bottom electrode, and the first variable resistance layer is disposed between the first bottom electrode and the first top electrode in a vertical direction. The second stacked structure includes a second bottom electrode, a second top electrode, and a second variable resistance layer. The second top electrode is disposed on the second bottom electrode, and the second variable resistance layer is disposed between the second bottom electrode and the second top electrode in the vertical direction. A thickness of the first variable resistance layer is less than a thickness of the second variable resistance layer.

According to an embodiment of the present invention, a manufacturing method of a resistive memory device is provided. The manufacturing method includes the following steps. A first stacked structure and a second stacked structure are formed on a dielectric layer. The first stacked structure includes a first bottom electrode, a first top electrode, and a first variable resistance layer. The first top electrode is disposed on the first bottom electrode, and the first variable resistance layer is disposed between the first bottom electrode and the first top electrode in a vertical direction. The second stacked structure includes a second bottom electrode, a second top electrode, and a second variable resistance layer. The second top electrode is disposed on the second bottom electrode, and the second variable resistance layer is disposed between the second bottom electrode and the second top electrode in the vertical direction. A thickness of the first variable resistance layer is less than a thickness of the second variable resistance layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-8 are schematic drawings illustrating a manufacturing method of a resistive memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIGS. 10-15 are schematic drawings illustrating a manufacturing method of a resistive memory device according to another embodiment of the present invention, wherein FIG. 11 is a schematic drawing in a step subsequent to FIG. 10, FIG. 12 is a schematic drawing in a step subsequent to FIG. 11, FIG. 13 is a schematic drawing in a step subsequent to FIG. 12 FIG. 14 is a schematic drawing in a step subsequent to FIG. 13, and FIG. 15 is a schematic drawing in a step subsequent to FIG. 14.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
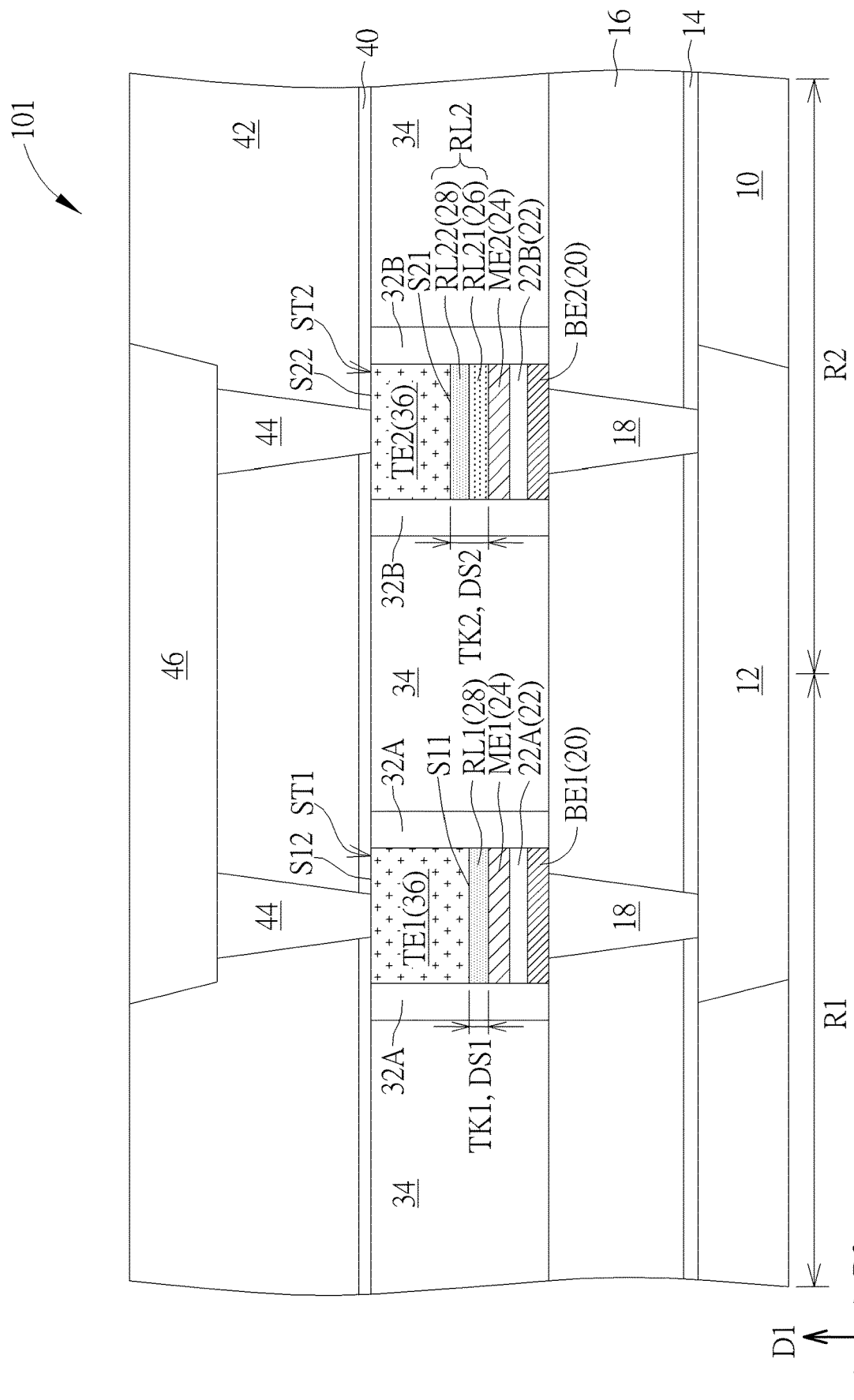
FIG. 1 is a schematic drawing illustrating a resistive memory device according to a first embodiment of the present invention.

Please refer to FIG. 1. FIG. 1 is a schematic drawing illustrating a resistive memory device 101 according to a first embodiment of the present invention. As shown in FIG. 1, the resistive memory device 101 includes a first stacked structure ST1 and a second stacked structure ST2. The first stacked structure ST1 includes a first bottom electrode BE1, a first top electrode TE1, and a first variable resistance layer RL1. The first top electrode TE1 is disposed on the first bottom electrode BE1, and the first variable resistance layer RL1 is disposed between the first bottom electrode BE1 and the first top electrode TE1 in a vertical direction (such as a first direction D1 shown in FIG. 1). The second stacked structure ST2 includes a second bottom electrode BE2, a second top electrode TE2, and a second variable resistance layer RL2. The second top electrode TE2 is disposed on the second bottom electrode BE2, and the second variable resistance layer RL2 is disposed between the second bottom electrode BE2 and the second top electrode TE2 in the first direction D1. A thickness TK1 of the first variable resistance layer RL1 in the first direction D1 is less than a thickness TK2 of the second variable resistance layer RL2 in the first direction D1.

In some embodiments, the first stacked structure ST1 and the second stacked structure ST2 may be regarded as resistive memory sub units including variable resistance material layers with different thicknesses, and each variable resistance material layer may be regarded as a switching medium in the resistive memory sub unit. The resistance of the resistive memory sub unit may be changed by applying suitable voltage to the top electrode and the bottom electrode in the stacked structure, and the resistive memory sub unit may switch to high resistance state (HRS) or low resistance state (LRS) for realizing the operation mode of the memory device, such as storing data, reading data, and resetting. Additionally, the operation voltage and/or the operation current for switching between the HRS and the LRS in the resistive memory sub unit and the resistance of the resistive memory sub unit in the HRS and the LRS may be changed by adjusting the thickness of the variable resistance material layer in the resistive memory sub unit, and multiple resistance states may be realized in the resistive memory device 101 accordingly.

For example, in some embodiments, the setting voltage ($V_{SET}$) for switching the first stacked structure ST1 including the relatively thinner first variable resistance layer RL1 to LRS from FIRS may be lower than the setting voltage for switching the second stacked structure ST2 including the relatively thicker second variable resistance layer RL2 to LRS from HRS. For instance, the setting voltage for switching the first stacked structure ST1 including the relatively thinner first variable resistance layer RL1 to LRS from FIRS may be about 0.5 volt, and the setting voltage for switching the second stacked structure ST2 including the relatively thicker second variable resistance layer RL2 to LRS from HRS may be about 1 volt, but not limited thereto. Therefore, by controlling the voltage applied to the first stacked structure ST1 and the second stacked structure ST2 respectively, both the first stacked structure ST1 and the second stacked structure ST2 may be kept in HRS, both the first stacked structure ST1 and the second stacked structure ST2 may be kept in LRS, or the first stacked structure ST1 may switch to LRS from HRS while the second stacked structure ST2 may be kept in HRS still. In other words, compared with the resistive memory sub units including the variable resistance material layers with the same thickness, the first stacked structure ST1 and the second stacked structure ST2 in this embodiment may be used to provide at least three different resistance states (both in HRS, both in LRS, and partly in HRS and partly in LRS), the multiple resistance states may be realized, and the data storage capacity of the resistive memory device 101 may be enhanced accordingly.

In some embodiments, the first stacked structure ST1 may be electrically connected with the second stacked structure ST2. For example, the first stacked structure ST1 may be electrically connected with the second stacked structure ST2 in parallel, but not limited thereto. In some embodiments, the first bottom BE1 of the first stacked structure ST1 may be electrically connected to the second bottom electrode BE2 of the second stacked structure ST2 via an electrically conductive structure (such as an electrically conductive layer 12 and connection plugs 18 shown in FIG. 1, but not limited thereto) disposed in a single dielectric layer or multiple dielectric layers (such as a dielectric layer 10, a dielectric layer 14, and a dielectric layer 16 shown in FIG. 1, but not limited thereto), and the first top TE1 of the first stacked structure ST1 may be electrically connected to the second top electrode TE2 of the second stacked structure ST2 via an electrically conductive structure (such as an electrically conductive layer 46 and connection plugs 44 shown in FIG. 1, but not limited thereto) disposed in a single dielectric layer or multiple dielectric layers (such as a dielectric layer 40 and a dielectric layer 42 shown in FIG. 1, but not limited thereto). In some embodiments, the first bottom electrode BE1 may be electrically connected with the second bottom electrode BE2 via an approach different from the approach described above, the first top electrode TE1 may be electrically connected with the second top electrode TE2 via an approach different from the approach described above, and the first stacked structure ST1 may be electrically connected with the second stacked structure ST2 via an approach different from the approach described above also according to some design considerations.

In some embodiments, the dielectric layer 10, the dielectric layer 14, the dielectric layer 16, the electrically conductive layer 12, and the connection plugs 18 may be disposed under the first stacked structure ST1 and the second stacked structure ST2; the dielectric layer 40, the dielectric layer 42, the connection plugs 44, and the electrically conductive layer 46 may be disposed above the first stacked structure ST1 and the second stacked structure ST2; and the first stacked structure ST1 and the second stacked structure ST2 may be disposed in a dielectric layer 34 located between the dielectric layer 16 and the dielectric layer 40 in the first direction D1, but not limited thereto. In other words, the resistive memory device 101 may further include the dielectric layer 10, the dielectric layer 14, the dielectric layer 16, the dielectric layer 34, the dielectric layer 40, the dielectric layer 42, the electrically conductive layer 12, the connection plugs 18, the connection plugs 44, and the electrically conductive layer 46 described above, but not limited thereto. Additionally, in some embodiments, the resistive memory device 101 may further include a first spacer 32A and a second spacer 32B disposed in the dielectric layer 34 and surrounding the first stacked structure ST1 and the second stacked structure ST2 in a horizontal direction (such as a second direction D2 shown in FIG. 1, but not limited thereto) respectively for protecting the first variable resistance layer RL1 and the second variable resistance layer RL2 and keeping material (such as oxygen) from entering the first variable resistance layer RL1 and the second variable resistance layer RL2 via the sidewalls of the first stacked structure ST1 and the second stacked structure ST2 and influencing the material characteristics of the first variable resistance layer RL1 and the second variable resistance layer RL2.

In some embodiments, the dielectric layer 10 may be disposed on a substrate (not shown), and the substrate may include a semiconductor substrate, such as a silicon substrate, a silicon germanium semiconductor substrate, a silicon-on-insulator (SOI) substrate, or a substrate made of other suitable materials, but not limited thereto. In addition, before the step of forming the dielectric layer 10, other units (such as transistors) and/or other circuits (not shown) may be formed on the substrate described above, and the electrically conductive layer 12 may be electrically connected downwardly with the units and/or the circuits on the substrate, but not limited thereto. In some embodiments, the manufacturing method of the resistive memory device 101 may be integrated with the back end of line (BEOL) process in the semiconductor manufacturing process. The dielectric layer 10, the dielectric layer 14, the dielectric layer 16, the dielectric layer 34, the dielectric layer 40, and the dielectric layer 42 described above may be regarded as interlayer dielectric formed in the BEOL process, and the electrically conductive layer 12, the connection plugs 18, the connection plugs 44, and the electrically conductive layer 46 described above may be regarded as a portion of an interconnection structure formed in the BEOL process, but not limited thereto.

In some embodiments, the first direction D1 described above may be regarded as a thickness direction of the dielectric layer 10, and a horizontal direction (such as the second direction D2) substantially orthogonal to the first direction D1 may be parallel with a surface of the dielectric layer 10, but not limited thereto. Additionally, in this description, a distance between the dielectric layer 10 and a relatively higher location and/or a relatively higher part in the first direction D1 is greater than a distance between the dielectric layer 10 and a relatively lower location and/or a relatively lower part in the first direction D1. The bottom of each part may be closer to the dielectric layer 10 in the first direction D1 than the top of this part. Another part disposed above a specific part may be regarded as being relatively far from the dielectric layer 10 in the first direction D1, and another part disposed under a specific part may be regarded as being relatively closer to the dielectric layer 10 in the first direction D1.

In some embodiments, the materials of the first variable resistance layer RL1 and the second variable resistance layer RL2 may respectively include metal oxide such as transition metal oxide, perovskite oxide, or other suitable variable resistance materials. The metal oxide described above may include nickel oxide, titanium oxide, hafnium oxide, zirconium oxide, zinc oxide, tungsten oxide, cobalt oxide, copper oxide, niobium oxide, molybdenum oxide, tantalum oxide, ferric oxide, manganese oxide, a mixture of the above-mentioned materials, or other suitable metal oxide materials. The perovskite oxide described above may include strontium titanate ($SrTiO_3$), barium titanate ($BaTiO_3$), lead titanate ($PbTiO_3$), or other suitable perovskite oxide materials. In some embodiments, the material composition of the first variable resistance layer RL1 may be identical to or different from the material composition of the second variable resistance layer RL2 according to some design considerations. For example, in some embodiments, the second variable resistance layer RL2 may include a first layer RL21 and a second layer RL22 stacked in the first direction D1, and the second layer RL22 may be disposed on the first layer RL21 in the first direction D1. In some embodiments, the material composition of the first variable resistance layer RL1 may be identical to a material composition of at least one of the first layer RL21 or the second layer RL22.

In some embodiments, the first layer RL21 of the second variable resistance layer RL2, the second layer RL22 of the second variable resistance layer RL2, and the first variable resistance layer RL1 may be formed of the same material and have the same material composition accordingly. In some embodiments, the material composition of the first layer RL21 of the second variable resistance layer RL2 may be different from the material composition of the second layer RL22 of the second variable resistance layer RL2. The first variable resistance layer RL1 and the first layer RL21 or the first variable resistance layer RL1 and the second layer RL22 may be formed of the same material and have the same material composition and substantially the same thickness, and the first layer RL21 or the second layer RL22 including a material different from the material of the first variable resistance layer RL1 may be used to increase the total thickness of the second variable resistance layer RL2, but not limited thereto. For example, in some embodiments, the first layer RL21 of the second variable resistance layer RL2 may be formed by patterning a first resistance material layer 26, and the first variable resistance layer RL1 and the second layer RL22 of the second variable resistance layer RL2 may be formed by patterning a second resistance material layer 28, but not limited thereto. It is worth noting that, in some embodiments, when the thickness of the first resistance material layer 26 is equal to the thickness of the second resistance material layer 28, the voltage for switching the first resistance material layer 26 to LRS from FIRS may be higher than the voltage for switching the second resistance material layer 28 to LRS from FIRS by adjusting the material compositions of the first resistance material layer 26 and the second resistance material layer 28. Accordingly, the difference between the voltage for switching the first stacked structure ST1 to LRS from HRS and the voltage for switching the second stacked structure ST2 to LRS from HRS may be further increased, and that will be beneficial to the operation of the resistive memory device 101, but not limited thereto.

In some embodiments, the first stacked structure ST1 may further include a first intermediate electrode ME1 and a first diode layer 22A, and the second stacked structure ST2 may further include a second intermediate electrode ME2 and a second diode layer 22B. The first intermediate electrode ME1 may be disposed between the first bottom electrode BE1 and the first top electrode TE1 in the first direction D1, the first variable resistance layer RL1 may be disposed between the first intermediate electrode ME1 and the first top electrode TE1 in the first direction D1, and the first diode layer 22A may be disposed between the first intermediate electrode ME1 and the first bottom electrode BE1 in the first direction D1. The second intermediate electrode ME2 may be disposed between the second bottom electrode BE2 and the second top electrode TE2 in the first direction D1, the second variable resistance layer RL2 may be disposed between the second intermediate electrode ME2 and the second top electrode TE2 in the first direction D1, and the second diode layer 22B may be disposed between the second intermediate electrode ME2 and the second bottom electrode BE2 in the first direction D1. In other words, the first bottom electrode BE1, the first diode layer 22A, the first intermediate electrode ME1, the first variable resistance layer RL1, and the first top electrode TE1 in the first stacked structure ST1 may be sequentially stacked and disposed from the bottom of the first stacked structure ST1 to the top of the first stacked structure ST1 in the first direction D1, and the second bottom electrode BE2, the second diode layer 22B, the second intermediate electrode ME2, the second variable resistance layer RL2, and the second top electrode TE2 in the second stacked structure ST2 may be sequentially stacked and disposed from the bottom of the second stacked structure ST2 to the top of the second stacked structure ST2 in the first direction D1

In some embodiments, the first variable resistance layer RL1 may directly contact the first intermediate electrode ME1 and the first top electrode TE1, and the second variable resistance layer RL2 may directly contact the second intermediate electrode ME2 and the second top electrode TE2. In this situation, a distance DS1 between the first top electrode TE1 and the first intermediate electrode ME1 in the first direction D1 may be substantially equal to the thickness TK1 of the first variable resistance layer RL1, a distance DS2 between the second top electrode TE2 and the second intermediate electrode ME2 in the first direction D1 may be substantially equal to the thickness TK2 of the second variable resistance layer RL2, and the distance DS1 between the first top electrode TE1 and the first intermediate electrode ME1 in the first direction D1 may be less than the distance DS2 between the second top electrode TE2 and the second intermediate electrode ME2 in the first direction D1 accordingly, but not limited thereto. Additionally, in some embodiments, a top surface S12 of the first top electrode TE1 and a top surface S22 of the second top electrode TE2 may be substantially coplanar, and a bottom surface S11 of the first top electrode TE1 may be lower than a bottom surface S21 of the second top electrode TE2 in the first direction D1. In some embodiments, the top surface S12 and the top surface S22 may be regarded as the topmost surface of the first top electrode TE1 and the topmost surface of the second top electrode TE2 in the first direction D1 respectively, the bottom surface S11 and the bottom surface S21 may be regarded as the bottommost surface of the first top electrode TE1 and the bottommost surface of the second top electrode TE2 in the first direction D1 respectively, and the thickness of the first top electrode TE1 in the first direction D1 may be greater than the thickness of the second top electrode TE2 in the first direction D1, but not limited thereto.

In some embodiments, the first intermediate electrode MEL the second intermediate electrode ME2, the first diode layer 22A, and the second diode layer 22B described above may be omitted and not disposed in the resistive memory device according to some design considerations, the first variable resistance layer RL1 may directly contact the first bottom electrode BE1 and the first top electrode TE1, and the second variable resistance layer RL2 may directly contact the second bottom electrode BE2 and the second top electrode TE2, but not limited thereto. No matter whether the first intermediate electrode MEL the second intermediate electrode ME2, the first diode layer 22A, and the second diode layer 22B are disposed in the resistive memory device or not, the distance between the first top electrode TE1 and the first bottom electrode BE1 in the first direction D1 may be less than the distance between the second top electrode TE2 and the second bottom electrode BE2 in the first direction D1.

In some embodiments, the materials of the first bottom electrode BE1, the second bottom electrode BE2, the first intermediate electrode ME1, the second intermediate electrode ME2, the first top electrode TE1, and the second top electrode TE2 may respectively include aluminum, platinum, ruthenium, iridium, nickel, cobalt, chromium, tungsten, copper, hafnium, zirconium, zinc, gold, titanium, an alloy of the material described above, a mixture of the material described above, or other suitable metallic electrically conductive materials or non-metallic electrically conductive materials. In some embodiments, the first diode layer 22A and the second diode layer 22B may respectively include a p-type semiconductor layer and an n-type semiconductor layer (not shown) stacked in the first direction D1 for forming a diode structure between the first intermediate electrode ME1 and the first bottom electrode BE1 and forming a diode structure between the second intermediate electrode ME2 and the second bottom electrode BE2, respectively, but not limited thereto. In some embodiments, the first diode layer 22A and the second diode layer 22B may include other suitable diode structures, respectively. In addition, the p-type semiconductor layer described above may include a p-type silicon semiconductor layer, a p-type cupric oxide (CuO) semiconductor layer, or other suitable p-type semiconductor materials, and the n-type semiconductor layer described above may include an n-type silicon semiconductor layer, an n-type indium zinc oxide (InZnO) semiconductor layer, or other suitable n-type semiconductor materials. Additionally, the p-type semiconductor layer in the first diode layer 22A and the p-type semiconductor layer in the second diode layer 22B may be disposed between the n-type semiconductor layer and the bottom electrode in the first direction D1 respectively for controlling the current direction in the first stacked structure ST1 and the second stacked structure ST2 under the structures shown in FIG. 1, but not limited thereto.

The dielectric layer 10, the dielectric layer 14, the dielectric layer 16, the dielectric layer 34, the dielectric layer 40, and the dielectric layer 42 described above may respectively include silicon oxide, silicon nitride, silicon carbonitride, fluorosilicate glass (FSG), or other suitable dielectric materials. Additionally, in some embodiments, the dielectric layer 10, the dielectric layer 16, the dielectric layer 34, and the dielectric layer 42 may respectively include a low dielectric constant (low-k) dielectric material, such as benzocyclclobutene (BCB), hydrogen silsesquioxane (HSQ), methyl silesquioxane (MSQ), hydrogenated silicon oxycarbide (SiOC—H), a porous dielectric material, or other suitable low-k dielectric materials. The first spacer 32A and the second spacer 32B described above may respectively include a single layer or multiple layers of dielectric materials, such as silicon nitride, silicon carbonitride, or other suitable dielectric materials. The electrically conductive layer 12, the connection plugs 18, the connection plugs 44, and the electrically conductive 46 described above may respectively include a low resistance material and a barrier layer, but not limited thereto. The low resistance material described above may include materials with relatively lower resistivity, such as copper, aluminum, and tungsten, and the barrier layer described above may include titanium nitride, tantalum nitride, or other suitable electrically conductive barrier materials, but not limited thereto.

Figure 2:
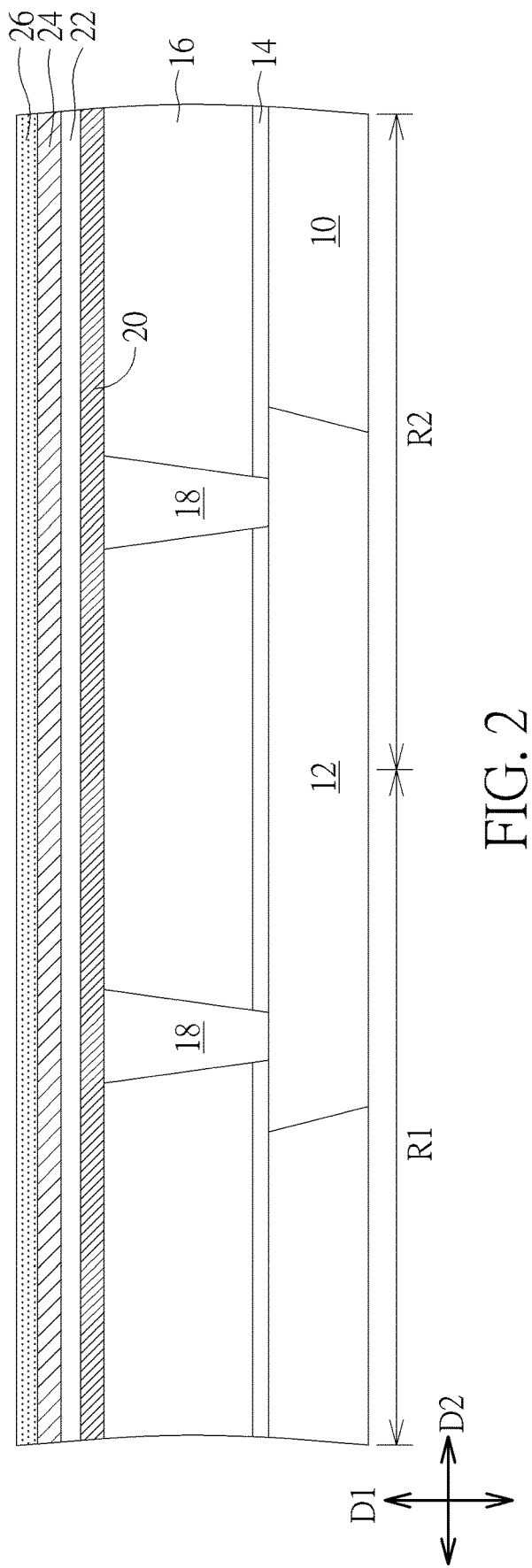
Figure 3:
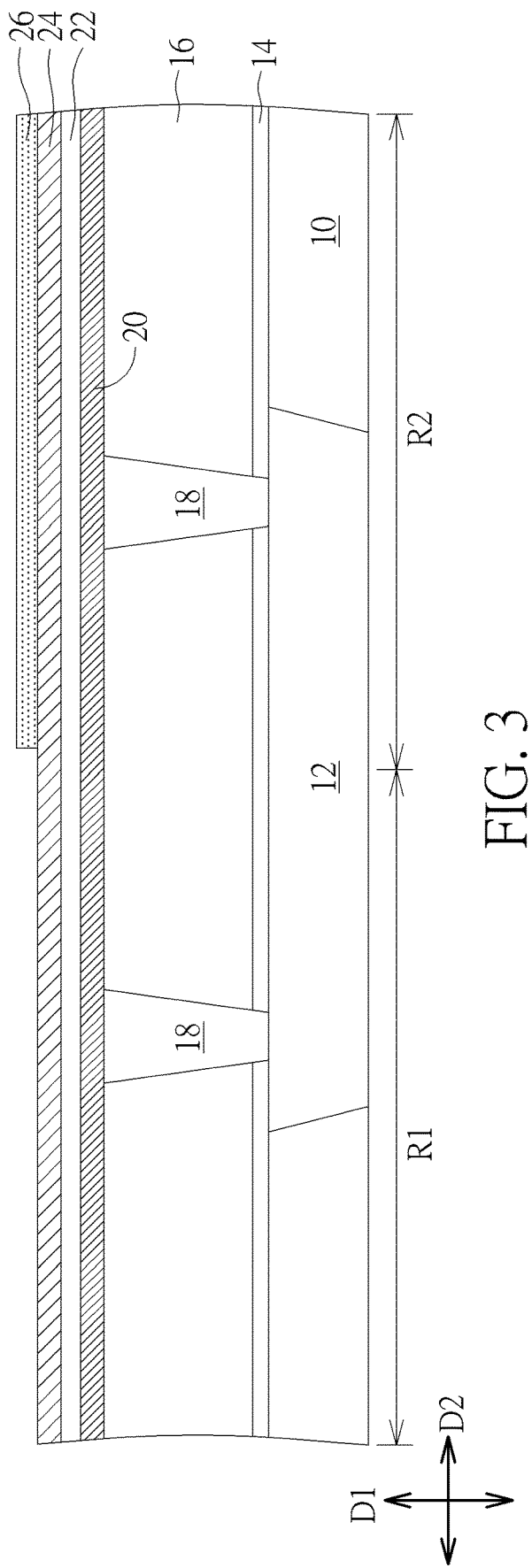
Figure 4:
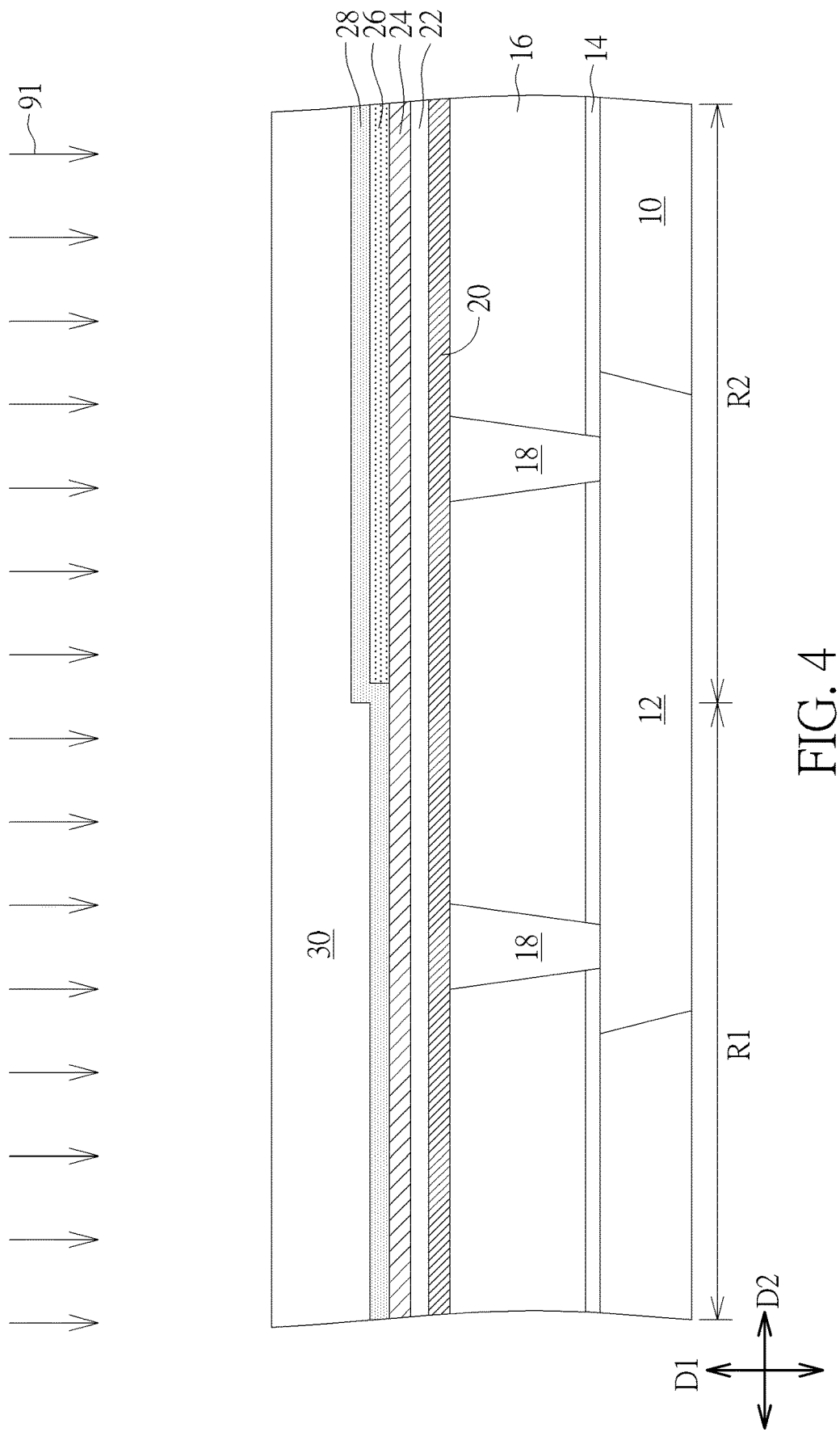
Figure 5:
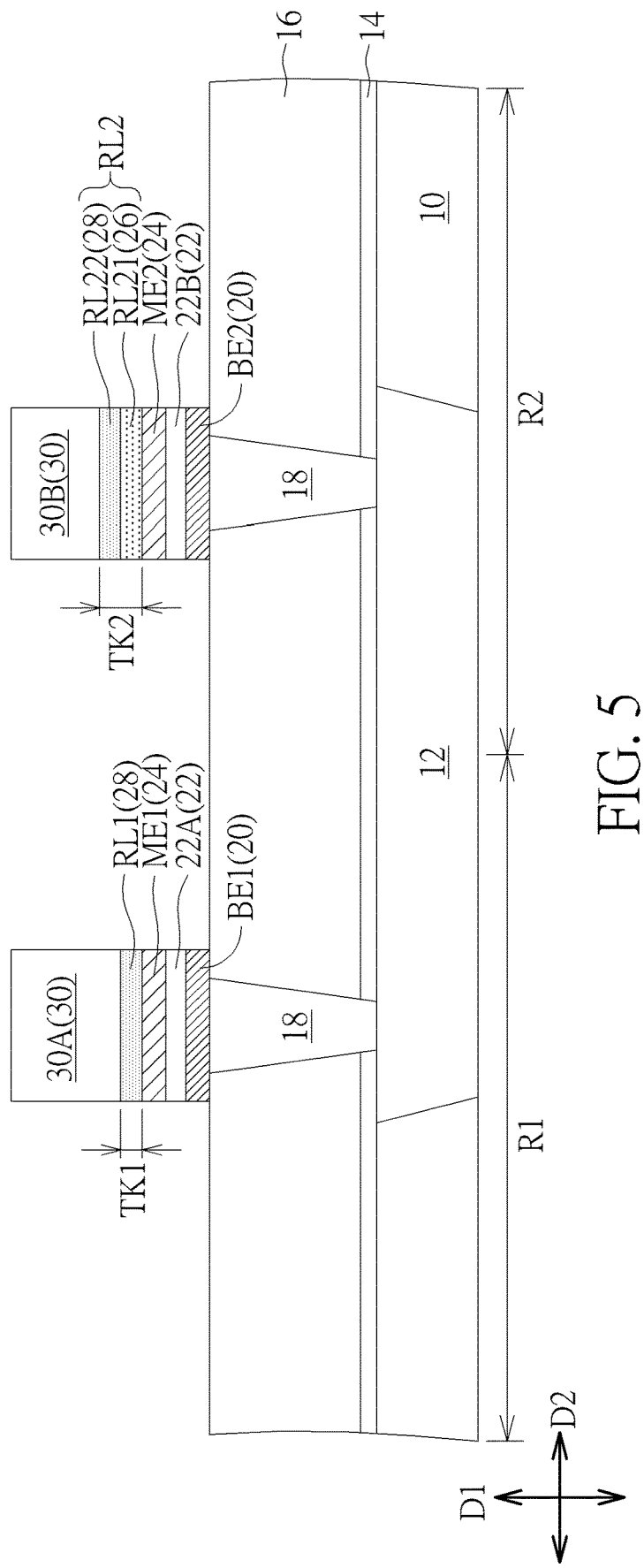
Figure 6:
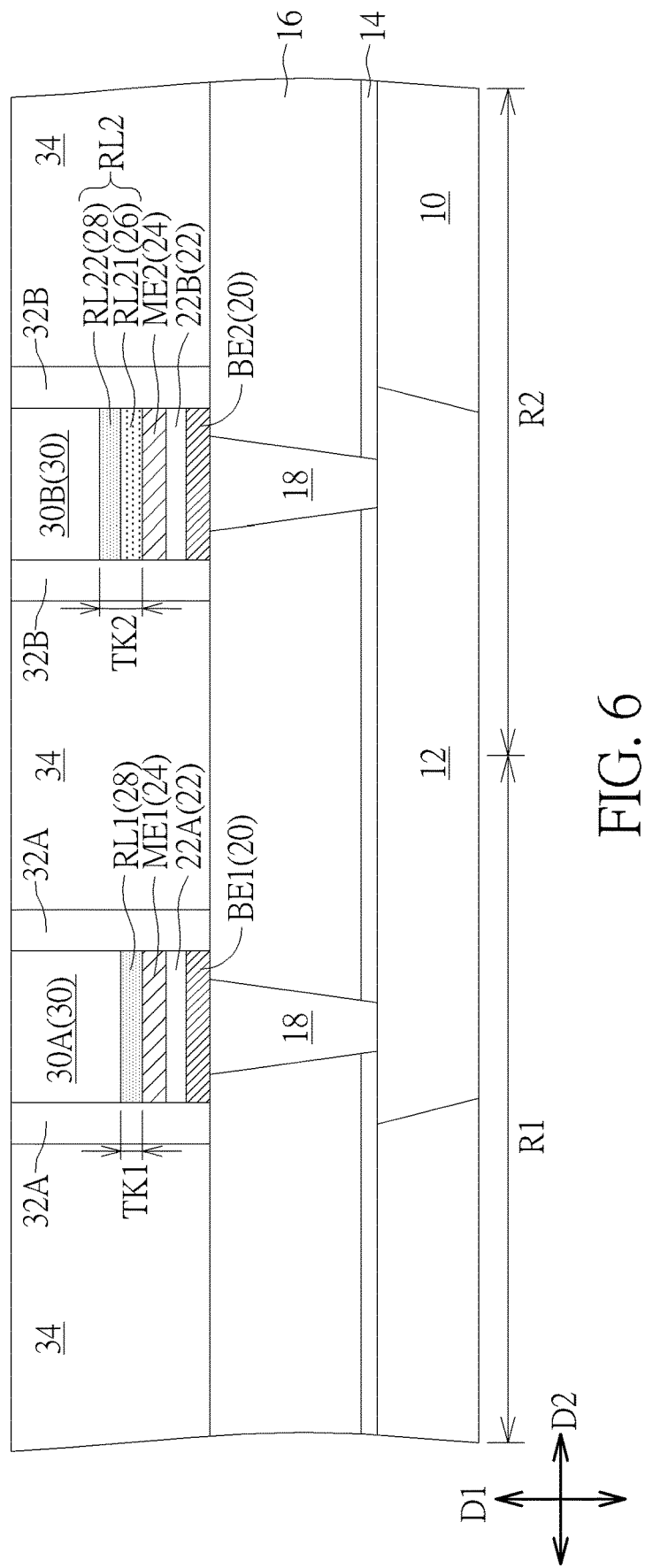
Figure 7:
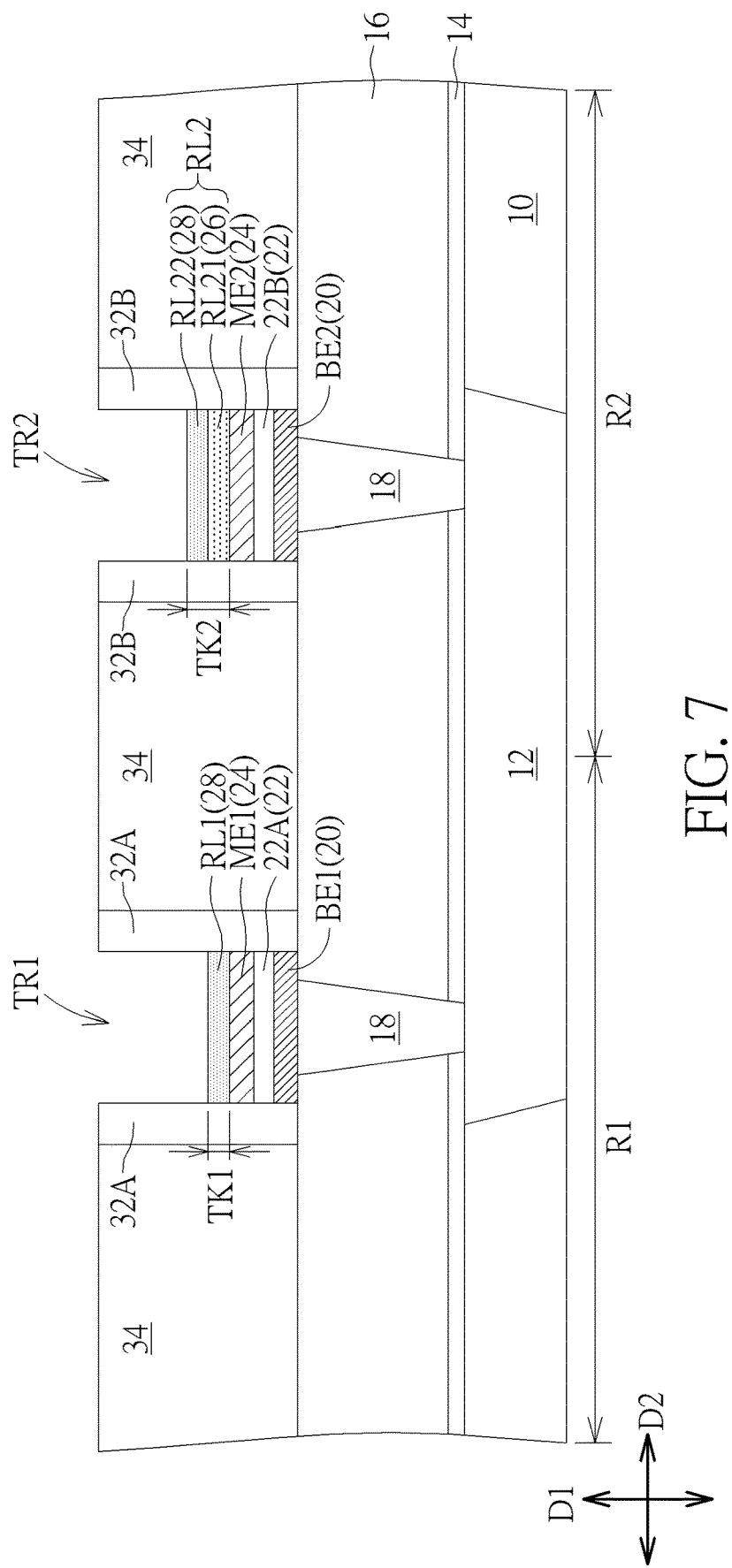
Figure 8:
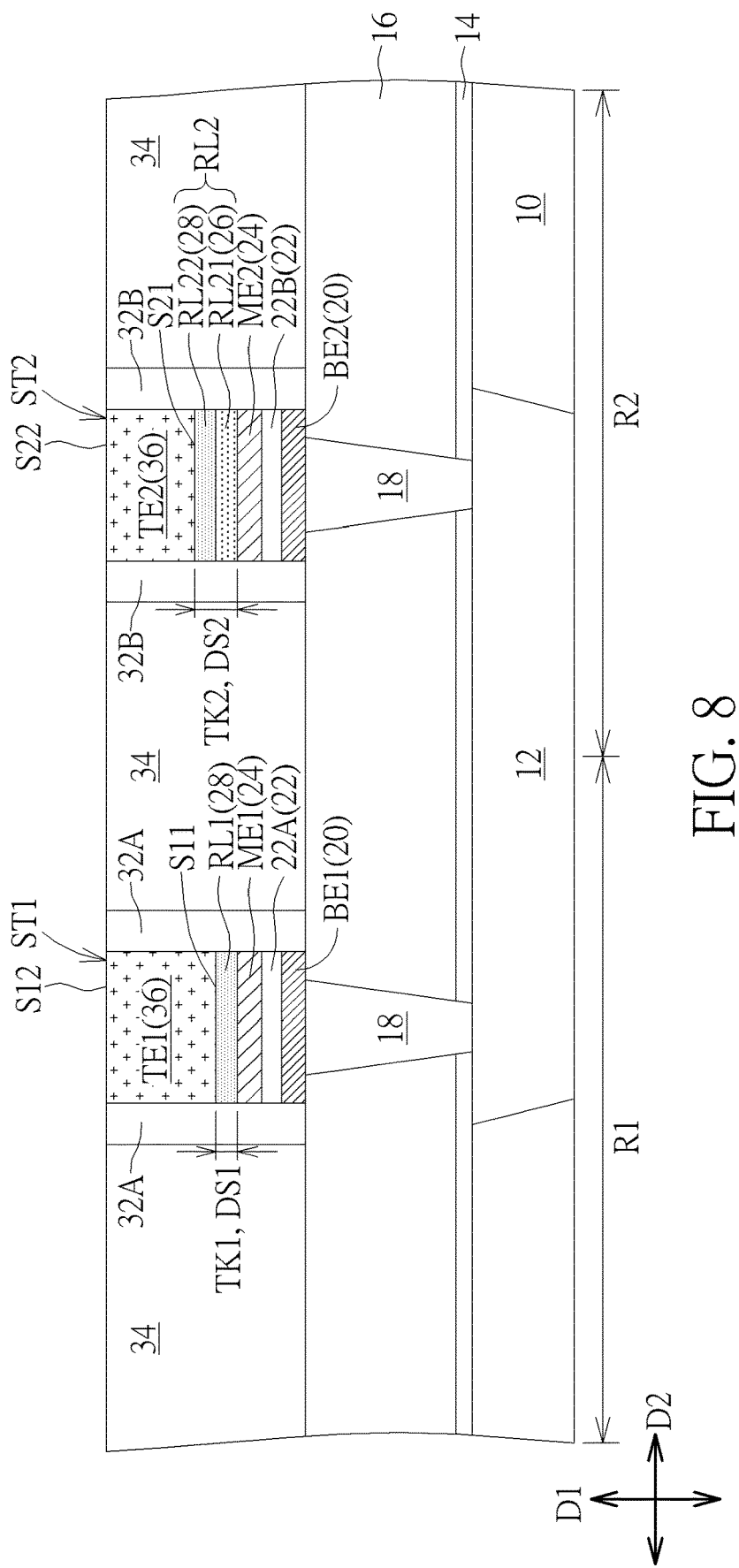

Please refer to FIGS. 1-8. FIGS. 2-8 are schematic drawings illustrating a manufacturing method of a resistive memory device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7. In some embodiments, FIG. 1 may be regarded as a schematic drawing in a step subsequent to FIG. 8, but not limited thereto. As shown in FIG. 1, a manufacturing method of the resistive memory device 101 may include the following steps. Firstly, the first stacked structure ST1 and the second stacked structure ST2 are formed on the dielectric layer 10. The first stacked structure ST1 includes the first bottom electrode BE1, the first top electrode TE1, and the first variable resistance layer RL1. The first top electrode TE1 is disposed on the first bottom electrode BE1, and the first variable resistance layer RL1 is disposed between the first bottom electrode BE1 and the first top electrode TE1 in the first direction D1. The second stacked structure ST2 includes the second bottom electrode BE2, the second top electrode TE2, and the second variable resistance layer RL2. The second top electrode TE2 is disposed on the second bottom electrode BE2, and the second variable resistance layer RL2 is disposed between the second bottom electrode BE2 and the second top electrode TE2 in the first direction D1. The thickness TK1 of the first variable resistance layer RL1 is less than the thickness TK2 of the second variable resistance layer RL2.

Specifically, the manufacturing method in this embodiment may include but is not limited to the following steps. Firstly, as shown in FIG. 2, the electrically conductive layer 12 may be formed in the dielectric layer 10. The dielectric layer 14 and the dielectric layer 16 may be formed on the dielectric layer 10 and the electrically conductive layer 12, and the connection plugs 18 may penetrate through the dielectric layer 16 and the dielectric layer 14 in the first direction D1 for contacting and being electrically connected with the electrically conductive layer 12. Subsequently, a first electrically conductive layer 20, a diode material layer 22, a second electrically conductive layer 24, and the first resistance material layer 26 may be sequentially formed on the dielectric layer 16 and the connection plugs 18. In some embodiments, a first region R1 and a second region R2 may be defined on the dielectric layer 10, and the first region R1 may be disposed adjacent to the second region R2. The first region R1 may be a region where the first stacked structure ST1 shown in FIG. 1 is going to be formed, and the second region R2 may be a region where the second stacked structure ST2 shown in FIG. 1 is going to be formed. In other words, the first region R1 and the second region R2 may be regarded as regions corresponding to different resistive memory sub units, but not limited thereto. The first electrically conductive layer 20, the diode material layer 22, the second electrically conductive layer 24, and the first resistance material layer 26 may be formed on the first region R1 and the second region R2.

As shown in FIG. 3, the first resistance material layer 26 on the first region R1 is then removed, and a part of the first resistance material layer 26 remains on the second region R2 after the step of removing the first resistance material layer 26 on the first region R1. Subsequently, as shown in FIG. 4, a second resistance material layer 28 is formed on the first region R1 and the second region R2, and a mask layer 30 is formed on the second resistance material layer 28. A part of the second resistance material layer 28 may be formed on the part of the first resistance material layer 26 remaining on the second region R2. The mask layer 30 may include polysilicon or other suitable materials without negative influence on the second resistance material layer 28. As shown in FIG. 4 and FIG. 5, after the step of forming the mask layer, a patterning process 91 may be performed to the second resistance material layer 28 and the part of the first resistance material layer 26 remaining on the second region R2 for forming the first variable resistance layer RL1 on the first region R1 and the second variable resistance layer RL2 on the second region R2. In other words, the mask layer 30 may be formed before the patterning process 91, but not limited thereto. In some embodiments, the manufacturing method may not include the step of forming the mask layer 30 described above according to some design considerations. In some embodiments, a patterned photoresist (not shown) may be formed on the mask layer 30 in the patterning process 91 and be used as an etching mask in an etching process, the patterning process 91 may include one or more etching steps for etching the mask layer 30, the second resistance material layer 28, the first resistance material layer 26, the second electrically conductive layer 24, the diode material layer 22, and the first electrically conductive layer 20 respectively, and the patterned photoresist may be removed in the etching steps or after the patterning process 91, but not limited thereto.

In other words, the first electrically conductive layer 20 may be patterned to be the first bottom electrode BE1 on the first region R1 and the second bottom electrode BE2 on the second region R2 by the patterning process 91, and the first bottom electrode BE1 and the second bottom electrode BE2 are separated from each other. The diode material layer 22 may be patterned to be the first diode layer 22A on the first region R1 and the second diode layer 22B on the second region R2 by the patterning process 91, and the first diode layer 22A and the second diode layer 22B are separated from each other. The second electrically conductive layer 24 may be patterned to be the first intermediate electrode ME1 on the first region R1 and the second intermediate electrode ME2 on the second region R2 by the patterning process 91, and the first intermediate electrode ME1 and the second intermediate electrode ME2 are separated from each other. The part of the first resistance material layer 26 remaining on the second region R2 may be patterned to be the first layer RL21 of the second variable resistance layer RL2 on the second region R2 by the patterning process 91. The second resistance material layer 28 may be pattered to be the first variable resistance layer RL1 on the first region R1 and the second layer RL22 of the second variable resistance layer RL2 on the second region R2 by the patterning process 91, and the first variable resistance layer RL1 is separated from the second layer RL22 of the second variable resistance layer RL2. Additionally, in some embodiments, the mask layer 30 may be patterned to be a first mask pattern 30A on the first variable resistance layer RL1 and a second mask pattern 30B on the second variable resistance layer RL2 by the patterning process 91, and the first mask pattern 30A and the second mask pattern 30B are separated from each other, but not limited thereto.

It is worth noting that, the method of forming the first variable resistance layer RL1 and the second variable resistance layer RL2 in this embodiment is not limited to the approach shown in FIGS. 2-5 described above, and other suitable approaches may be used to form the first variable resistance layer RL1 and the second variable resistance layer RL2 according to some design considerations. Additionally, in some embodiments, a projection area of the first bottom electrode BE1 in the first direction D1, a projection area of the first diode layer 22A in the first direction D1, a projection area of the first intermediate electrode ME1 in the first direction D1, a projection area of the first variable resistance layer RL1 in the first direction D1, and a projection area of the first mask pattern 30A in the first direction D1 may be substantially equal to one another; and a projection area of the second bottom electrode BE2 in the first direction D1, a projection area of the second diode layer 22B in the first direction D1, a projection area of the second intermediate electrode ME2 in the first direction D1, a projection area of the second variable resistance layer RL2 in the first direction D1, and a projection area of the second mask pattern 30B in the first direction D1 may be substantially equal to one another because the first bottom electrode BE1, the second bottom electrode BE2, the first diode layer 22A, the second diode layer 22B, the first intermediate electrode ME1, the second intermediate electrode ME2, the first variable resistance layer RL1, the second variable resistance layer RL2, the first mask pattern 30A, and the second mask pattern 30B may be formed by one patterning process, but not limited thereto. In some embodiments, the first bottom electrode BE1, the second bottom electrode BE2, the first diode layer 22A, the second diode layer 22B, the first intermediate electrode ME1, the second intermediate electrode ME2, the first variable resistance layer RL1, the second variable resistance layer RL2, the first mask pattern 30A, and the second mask pattern 30B may be formed respectively by different patterning processes according to some design considerations, and the projection areas of at least some of the parts described above in the first direction D1 may be different from one another accordingly.

Subsequently, as shown in FIG. 6, the first spacer 32A may be formed on sidewalls of the first bottom electrode BE1, sidewalls of the first diode layer 22A, sidewalls of the first intermediate electrode ME1, sidewalls of the first variable resistance layer RL1, and sidewalls of the first mask pattern 30A, and the second spacer 32B may be formed on sidewalls of the second bottom electrode BE2, sidewalls of the second diode layer 22B, sidewalls of the second intermediate electrode ME2, sidewalls of the second variable resistance layer RL2, and sidewalls of the second mask pattern 30B. The first spacer 32A may surround the first bottom electrode BE1, the first diode layer 22A, the first intermediate electrode ME1, the first variable resistance layer RL1, and the first mask pattern 30A in the horizontal direction, and the second spacer 32B may surround the second bottom electrode BE2, the second diode layer 22B, the second intermediate electrode ME2, the second variable resistance layer RL2, and the second mask pattern 30B in the horizontal direction. The dielectric layer 34 may then be formed, and the top surface of the first mask pattern 30A, the top surface of the second mask pattern 30B, the top surface of the first spacer 32A, the top surface of the second spacer 32B, and the top surface of the dielectric layer 34 may be substantially coplanar by performing a planarization process (such as a chemical mechanical polishing process, but not limited thereto), but not limited thereto.

As shown in FIGS. 6-8, the first mask pattern 30A may then be replaced with the first top electrode TE1, and the second mask pattern 30B may then be replaced with the second top electrode TE2. For example, the first mask pattern 30A and the second mask pattern 30B may be removed for forming a first trench TR1 surrounded by the first spacer 32A and located above the first variable resistance layer RL1 and forming a second trench TR2 surrounded by the second spacer 32B and located above the second variable resistance layer RL2. Subsequently, a third electrically conductive layer 36 may be formed, and the first trench TR1 and the second trench TR2 may be filled with the third electrically conductive layer 36. The third electrically conductive layer 36 located outside the first trench TR1 and the second trench TR2 may be removed by performing a planarization process (such as a chemical mechanical polishing process, but not limited thereto) for forming the first top electrode TE1 in the first trench TR1 and forming the second top electrode TE2 in the second trench TR2 respectively, and the first stacked structure ST1 and the second stacked structure ST2 may be formed accordingly. As shown in FIG. 1, the dielectric layer 40, the dielectric layer 42, the connection plugs 44, and the electrically conductive layer 46 described above may then be formed on the first stacked structure ST1 and the second stacked structure ST2, and the resistive memory device 101 shown in FIG. 1 may be formed accordingly.

The first variable resistance layer RL1 and the second variable resistance layer RL2 with different thicknesses may be formed by the manufacturing method described above, the etching damage to the variable resistance layer when a part of the variable resistance layer is thinned directly by an etching back approach may be avoided, and that will be beneficial to the electrical performance of the resistive memory device.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
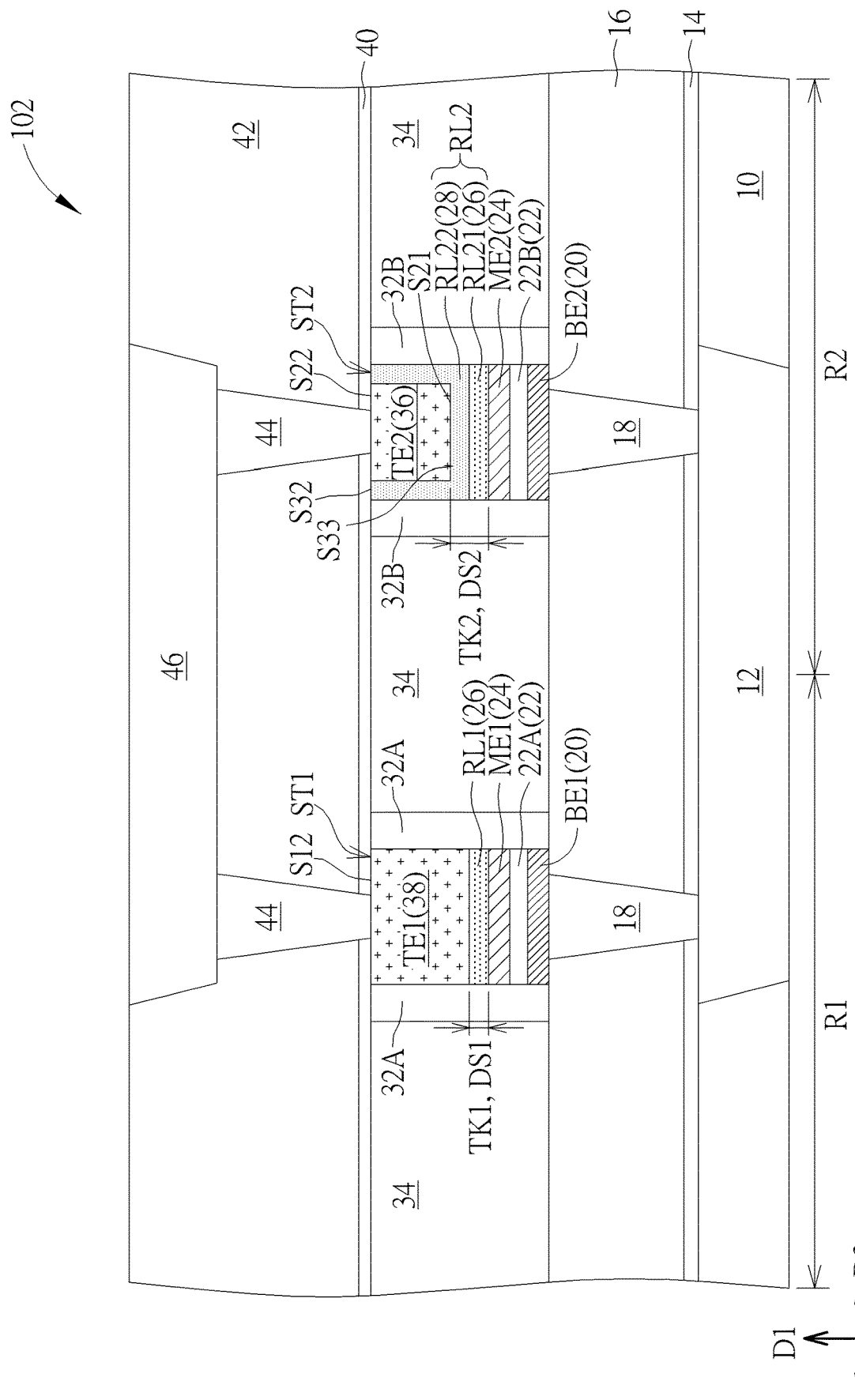
FIG. 9 is a schematic drawing illustrating a resistive memory device according to a second embodiment of the present invention.

Please refer to FIG. 9. FIG. 9 is a schematic drawing illustrating a resistive memory device 102 according to a second embodiment of the present invention. As shown in FIG. 9, the difference between the resistive memory device 102 and the resistive memory device in the first embodiment described above is that, in a cross-sectional view of the second variable resistance layer RL2 (such as FIG. 9), the second layer RL22 of the second variable resistance layer RL2 in the resistive memory device 102 may include a U-shaped structure surrounding the second top electrode TE2 in a horizontal direction (such as the second direction D2). In this embodiment, the thickness TK2 of the second variable resistance layer RL2 may be regarded as a thickness of the second variable resistance layer RL2 located between the second top electrode TE2 and the second intermediate electrode ME2 in the first direction D1, and the distance DS2 between the second top electrode TE2 and the second intermediate electrode ME2 in the first direction D1 may be substantially equal to the thickness TK2 of the second variable resistance layer RL2, but not limited thereto. In some embodiments, a top surface S33 of the second variable resistance layer RL2 located between the second top electrode TE2 and the second intermediate electrode ME2 in the first direction D1 may be lower than a top surface S32 of the second layer RL22 of the second variable resistance layer RL2 in the first direction D1, and the top surface S32 of the second layer RL22 of the second variable resistance layer RL2 and the top surface S22 of the second top electrode TE2 may be substantially coplanar, but not limited thereto.

Additionally, in some embodiments, the first variable resistance layer RL1 and the first layer RL21 of the second variable resistance layer RL2 may be formed of the same material layer (such as the first resistance material layer 26), the second layer RL22 of the second variable resistance layer RL2 may be formed of another material layer (such as the second resistance material layer 28), and the material composition of the second layer RL22 of the second variable resistance layer RL2 may be different from the material composition of the first variable resistance layer RL1 accordingly, but not limited thereto. It is worth noting that, in some embodiments, when the thickness of the first resistance material layer 26 is equal to the thickness of the second resistance material layer 28, the voltage for switching the second resistance material layer 28 to LRS from HRS may be higher than the voltage for switching the first resistance material layer 26 to LRS from HRS by adjusting the material compositions of the first resistance material layer 26 and the second resistance material layer 28. Accordingly, the difference between the voltage for switching the first stacked structure ST1 to LRS from HRS and the voltage for switching the second stacked structure ST2 to LRS from HRS in this embodiment may be further increased, and that will be beneficial to the operation of the resistive memory device 102, but not limited thereto.

Figure 10:
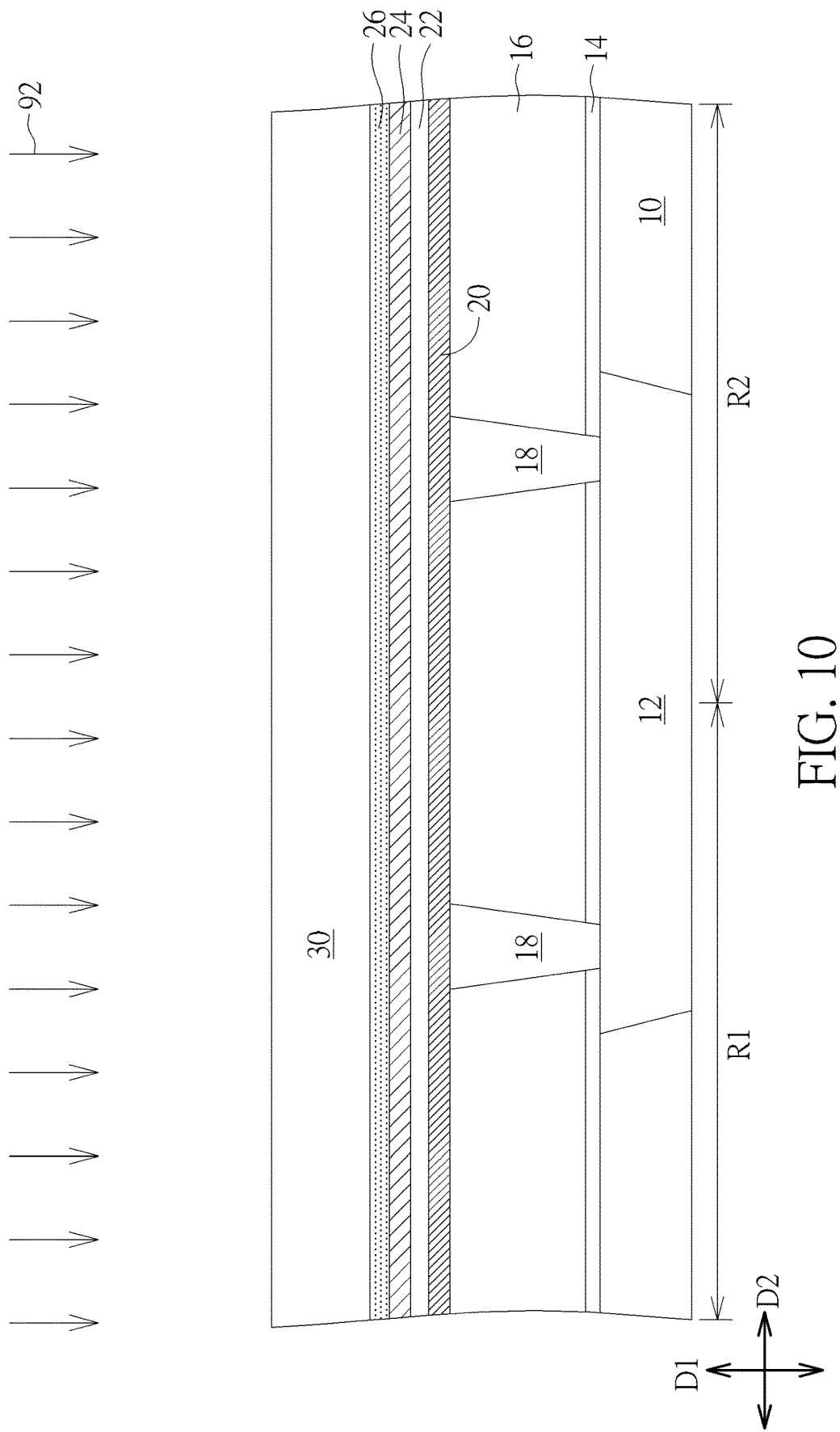
Figure 11:
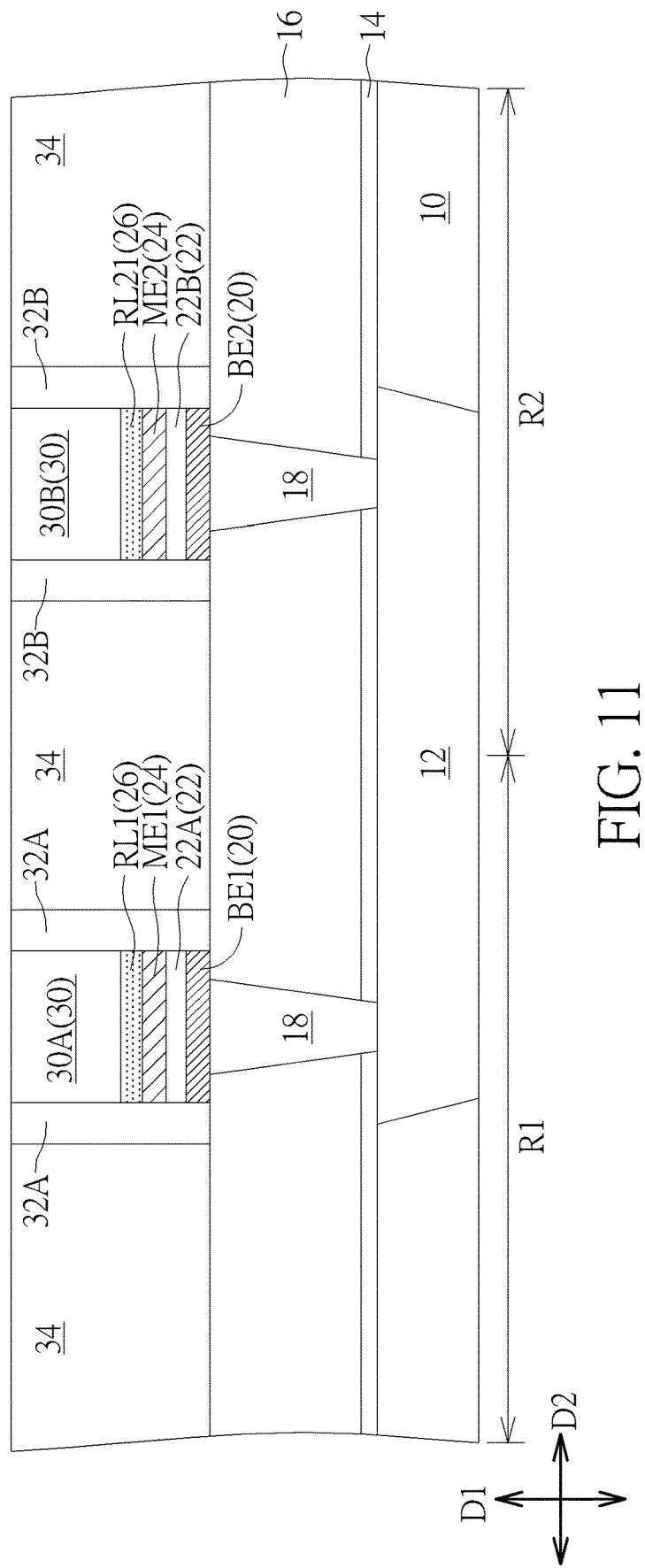
Figure 12:
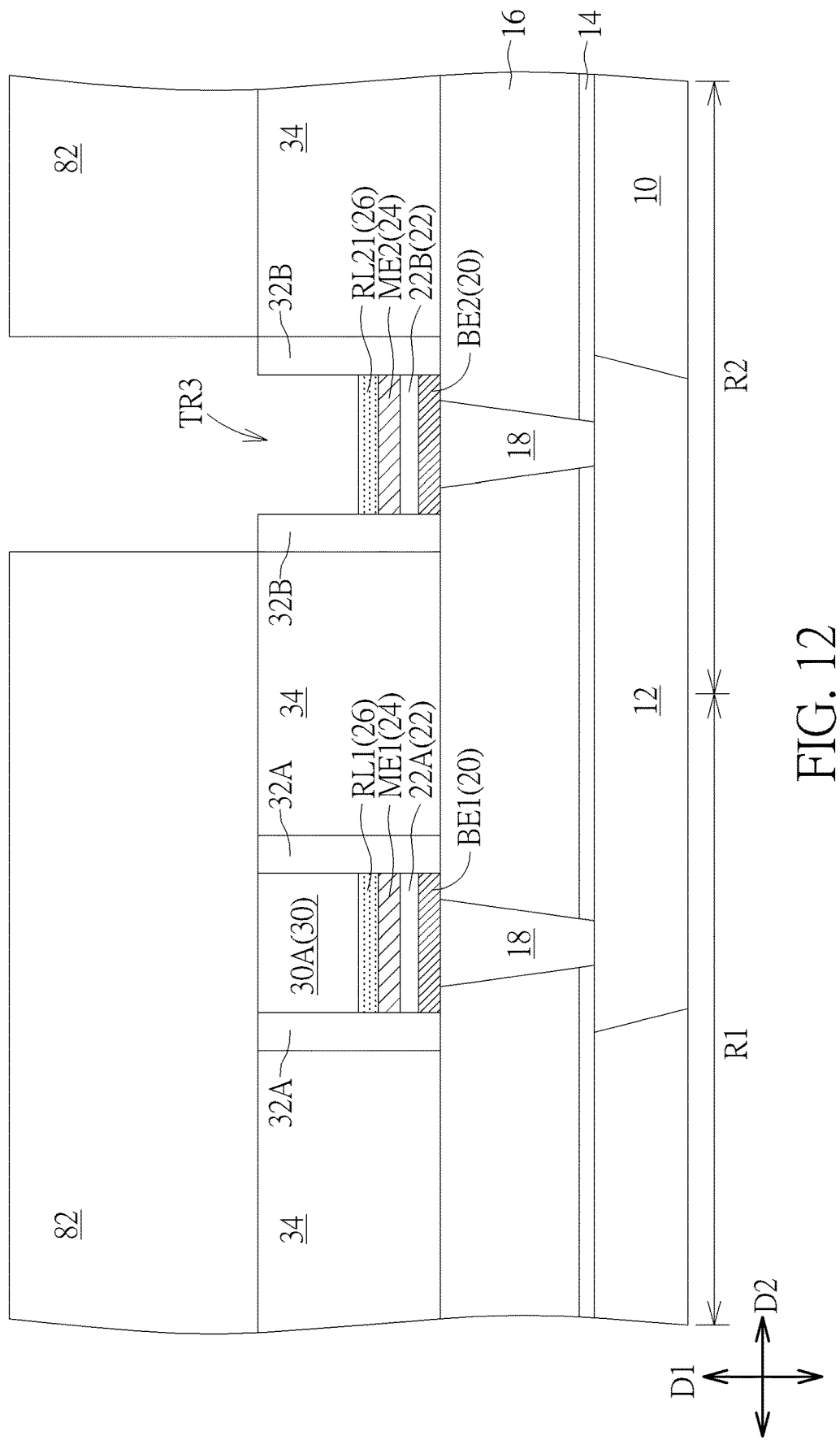
Figure 13:
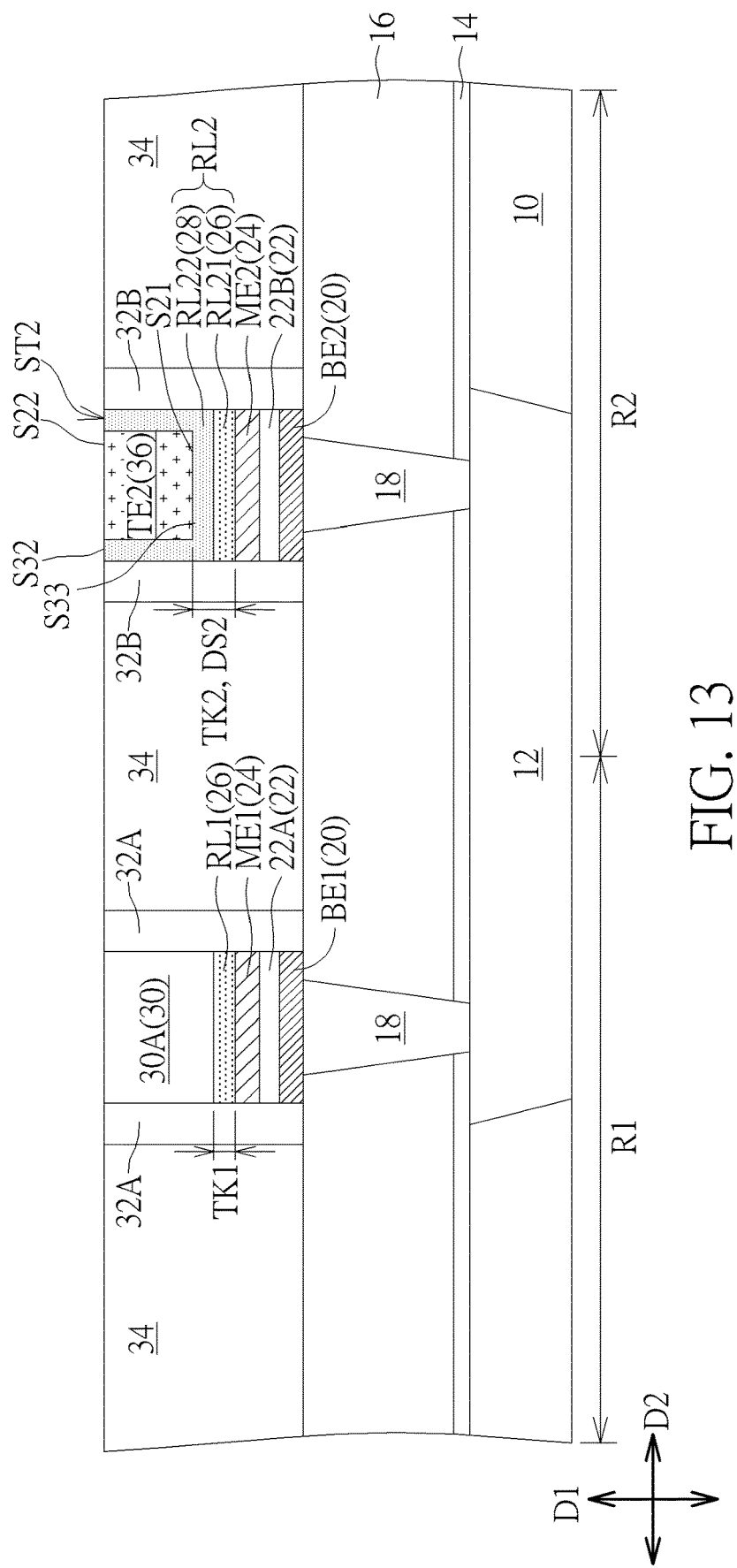
Figure 14:
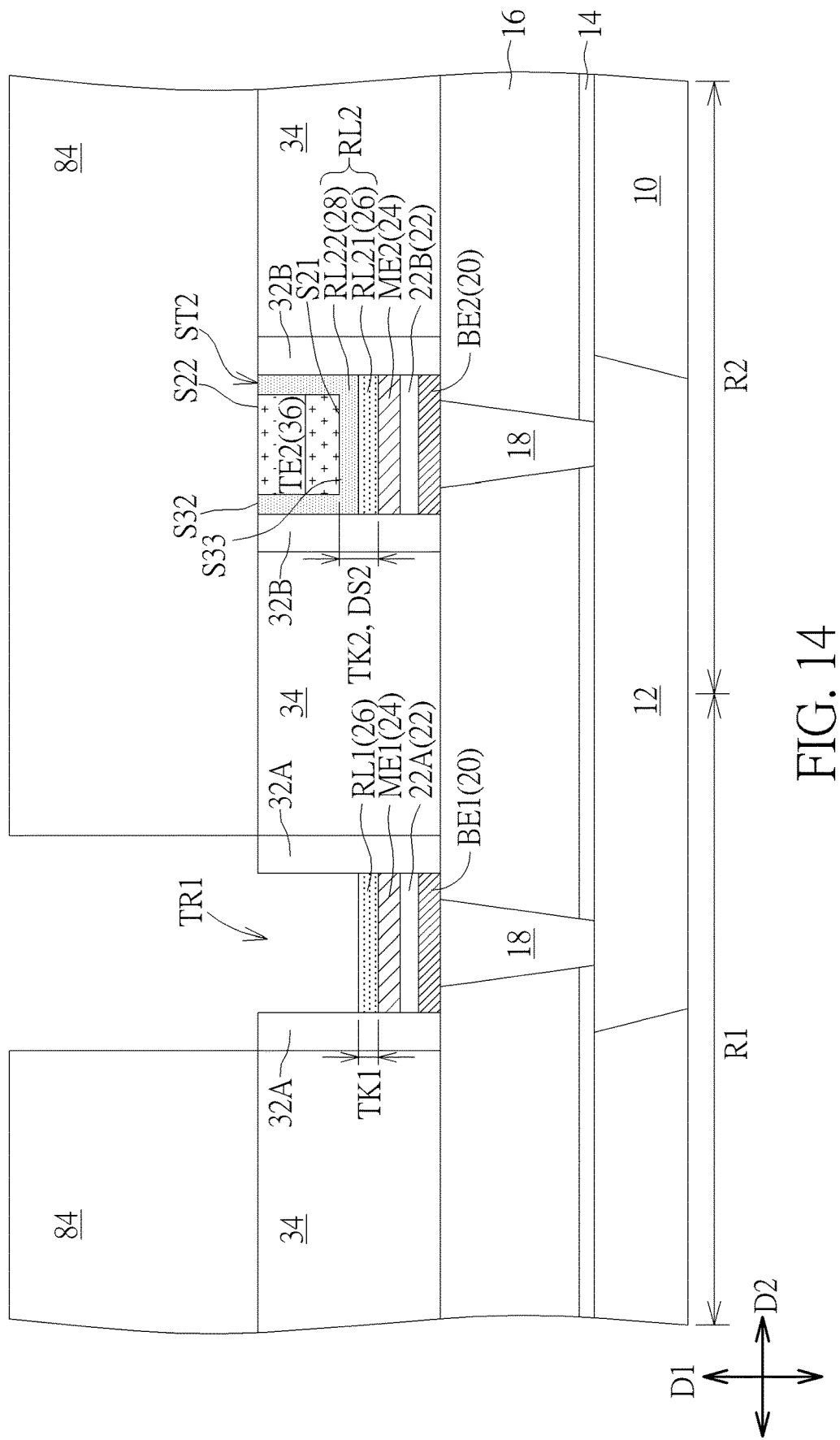
Figure 15:
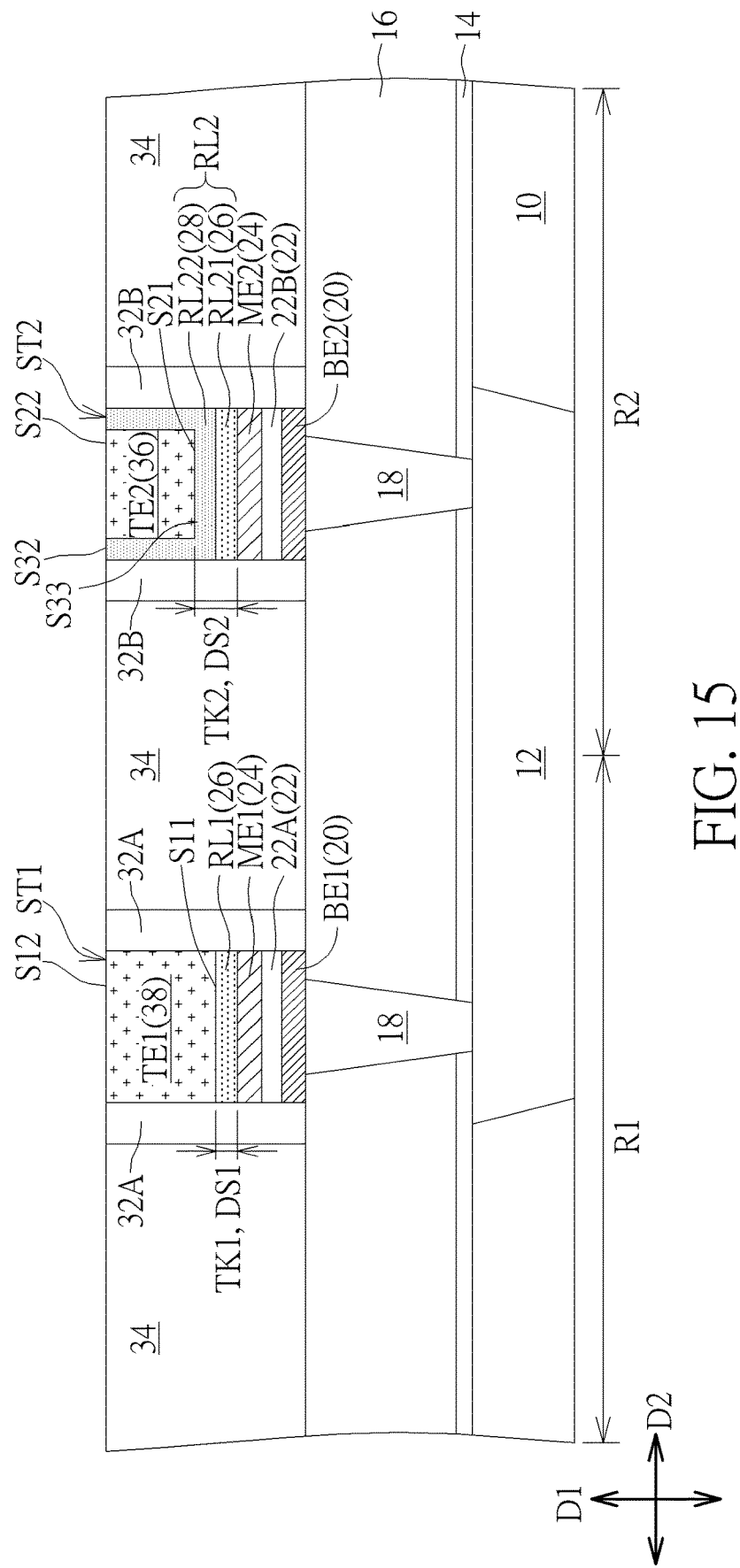

Please refer to FIGS. 9-15. FIGS. 10-15 are schematic drawings illustrating a manufacturing method of a resistive memory device according to another embodiment of the present invention, wherein FIG. 11 is a schematic drawing in a step subsequent to FIG. 10, FIG. 12 is a schematic drawing in a step subsequent to FIG. 11, FIG. 13 is a schematic drawing in a step subsequent to FIG. 12 FIG. 14 is a schematic drawing in a step subsequent to FIG. 13, and FIG. 15 is a schematic drawing in a step subsequent to FIG. 14. In some embodiments, FIG. 9 may be regarded as a schematic drawing in a step subsequent to FIG. 15, but not limited thereto. Firstly, as shown in FIG. 10, the first electrically conductive layer 20, the diode material layer 22, the second electrically conductive layer 24, the first resistance material layer 26, and the mask layer 30 may be sequentially formed on the dielectric layer 16 and the connection plugs 18. The first electrically conductive layer 20, the diode material layer 22, the second electrically conductive layer 24, the first resistance material layer 26, and the mask layer 30 may be formed on the first region R1 and the second region R2. Subsequently, as shown in FIG. 10 and FIG. 11, a patterning process 92 may be performed to the first resistance material layer 26 for forming the first variable resistance layer RL1 on the first region R1 and forming the first layer RL21 on the second region R2.

In other words, the mask layer 30 may be formed before the patterning process 92, but not limited thereto. In some embodiments, the manufacturing method may not include the step of forming the mask layer 30 described above according to some design considerations. In some embodiments, a patterned photoresist (not shown) may be formed on the mask layer 30 in the patterning process 92 and be used as an etching mask in an etching process, the patterning process 92 may include one or more etching steps for etching the mask layer 30, the first resistance material layer 26, the second electrically conductive layer 24, the diode material layer 22, and the first electrically conductive layer 20 respectively, and the patterned photoresist may be removed in the etching steps or after the patterning process 92, but not limited thereto. Therefore, the first electrically conductive layer 20 may be patterned to be the first bottom electrode BE1 and the second bottom electrode BE2 by the patterning process 92; the diode material layer 22 may be patterned to be the first diode layer 22A and the second diode layer 22B by the patterning process 92; the second electrically conductive layer 24 may be patterned to be the first intermediate electrode ME1 and the second intermediate electrode ME2 by the patterning process 92; and the first resistance material layer 26 may be patterned to be the first variable resistance layer RL1 on the first region R1 and the first layer RL21 on the second region R2 by the patterning process 92. In this embodiment, the first variable resistance layer RL1 is separated from the first layer RL21, and the second layer of the second variable resistance layer may be formed on the first layer RL21 after the patterning process 92. Additionally, in some embodiments, the mask layer 30 may be patterned to be the first mask pattern 30A on the first variable resistance layer RL1 and the second mask pattern 30B on the first layer RL21 by the patterning process 92, but not limited thereto.

Subsequently, as shown in FIG. 11 and FIG. 12, a patterned mask layer 82 may be formed covering the first region R1 and exposing the second mask pattern 30B, and the second mask pattern 30B may be removed by an etching process accordingly for forming a third trench TR3 surrounded by the second spacer 32B and located above the first layer RL21. As shown in FIGS. 11-13, after the step of removing the second mask pattern 30B, the patterned mask layer 82 is removed, the second layer RL22 is formed on the first layer RL21, and the second top electrode TE2 is formed on the second layer RL22. In some embodiments, the second resistance material layer 28 may be formed after the step of removing the second mask pattern 30B, and the third electrically conductive layer 36 may be formed on the second resistance material layer 28. The third trench TR3 may be filled with the second resistance material layer 28 and the third electrically conductive layer 36. The second resistance material layer 28 and the third electrically conductive layer 36 located outside the third trench TR3 may be removed by performing a planarization process (such as a chemical mechanical polishing process, but not limited thereto) for forming the second layer RL22 of the second variable resistance layer RL2 and the second top electrode TE2 in the third trench TR3, and the second stacked structure ST2 may be formed accordingly.

Subsequently, as shown in FIGS. 13-15, after the step of forming the second top electrode TE2, the first mask pattern 30A may be replaced with the first top electrode TE1 for forming the first stacked structure ST1 described above. In some embodiments, a patterned mask layer 84 may be formed covering the second region R2 and exposing the first mask pattern 30A, and the first mask pattern 30A may be removed by an etching process accordingly for forming the first trench TR1. The patterned mask layer 84 may be removed after the step of removing the first mask pattern 30A, a fourth electrically conductive layer 38 may be formed, and the first trench TR1 may be filled with the fourth electrically conductive layer 38. The fourth electrically conductive layer 38 located outside the first trench TR1 may be removed by performing a planarization process (such as a chemical mechanical polishing process, but not limited thereto) for forming the first top electrode TE1 in the first trench TR1, and the first stacked structure ST1 described above may be formed accordingly. As shown in FIG. 9, the dielectric layer 40, the dielectric layer 42, the connection plugs 44, and the electrically conductive layer 46 may then be formed on the first stacked structure ST1 and the second stacked structure ST2, and the resistive memory device 102 shown in FIG. 9 may be formed accordingly.

It is worth noting that, the method of forming the first variable resistance layer RL1 and the second variable resistance layer RL2 in this embodiment is not limited to the approach shown in FIGS. 10-13 described above, and other suitable approaches may be used to form the first variable resistance layer RL1 and the second variable resistance layer RL2 shown in FIG. 9 according to some design considerations. Additionally, in this embodiment, the material composition of the first top electrode TE1 may be different from the material composition of the second top electrode TE2 because the first top electrode TE1 and the second top electrode TE2 may be formed by different process steps, but not limited thereto. In addition, the etching damage to the second top electrode TE2 and/or the second layer RL22 of the second variable resistance layer RL2 in the patterning process may be avoided because the second top electrode TE2 and the second layer RL22 of the second variable resistance layer RL2 may be formed after the patterning process, and that will be beneficial to the electrical performance of the resistive memory device 102.

To summarize the above descriptions, in the resistive memory device and the manufacturing method thereof according to the present invention, the variable resistance layers with different thicknesses may be used to increase the number of switchable resistance states of the resistive memory device, and the resistive memory device with multiple resistance states may be realized accordingly. In addition, the variable resistance layers with different thicknesses may be formed and the etching damage to the variable resistance layers may be reduced by the manufacturing method of the present invention, and the overall electrical performance of the resistive memory device may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistive memory device, comprising:
   a first stacked structure, comprising:
      a first bottom electrode;
      a first top electrode disposed on the first bottom electrode; and
      a first variable resistance layer disposed between the first bottom electrode and the first top electrode in a vertical direction; and
   a second stacked structure, comprising:
      a second bottom electrode;
      a second top electrode disposed on the second bottom electrode; and
      a second variable resistance layer disposed between the second bottom electrode and the second top electrode in the vertical direction, wherein a thickness of the first variable resistance layer is less than a thickness of the second variable resistance layer, a top surface of the first top electrode and a top surface of the second top electrode are coplanar, and a bottom surface of the first top electrode is lower than a bottom surface of the second top electrode in the vertical direction.

2. The resistive memory device according to claim 1, wherein a material composition of the first variable resistance layer is identical to a material composition of the second variable resistance layer.

3. The resistive memory device according to claim 1, wherein the first bottom electrode is electrically connected with the second bottom electrode, and the first top electrode is electrically connected with the second top electrode.

4. The resistive memory device according to claim 1, wherein the second variable resistance layer comprises:
   a first layer; and
   a second layer disposed on the first layer, wherein a material composition of the first variable resistance layer is identical to a material composition of at least one of the first layer or the second layer.

5. The resistive memory device according to claim 4, wherein the material composition of the first layer is different from the material composition of the second layer.

6. The resistive memory device according to claim 4, wherein the second layer comprises a U-shaped structure surrounding the second top electrode in a cross-sectional view of the second variable resistance layer.

7. The resistive memory device according to claim 6, wherein the material composition of the second layer is different from the material composition of the first variable resistance layer.

8. The resistive memory device according to claim 6, wherein a top surface of the second layer and a top surface of the second top electrode are coplanar.

9. The resistive memory device according to claim 6, wherein the first stacked structure further comprises:
   a first intermediate electrode disposed between the first bottom electrode and the first top electrode in the vertical direction, wherein the first variable resistance layer is disposed between the first intermediate electrode and the first top electrode; and
   a first diode layer disposed between the first intermediate electrode and the first bottom electrode, wherein the second stacked structure further comprises:
   a second intermediate electrode disposed between the second bottom electrode and the second top electrode in the vertical direction, wherein the second variable resistance layer is disposed between the second intermediate electrode and the second top electrode; and
   a second diode layer disposed between the second intermediate electrode and the second bottom electrode.

10. The resistive memory device according to claim 9, wherein a distance between the first top electrode and the first intermediate electrode in the vertical direction is less than a distance between the second top electrode and the second intermediate electrode in the vertical direction.

11. The resistive memory device according to claim 9, wherein the first variable resistance layer directly contacts the first intermediate electrode and the first top electrode, and the second variable resistance layer directly contacts the second intermediate electrode and the second top electrode.

12. A resistive memory device, comprising:
   a first stacked structure, comprising:
      a first bottom electrode;
      a first top electrode disposed on the first bottom electrode; and
      a first variable resistance layer disposed between the first bottom electrode and the first top electrode in a vertical direction; and
   a second stacked structure, comprising:
      a second bottom electrode;
      a second top electrode disposed on the second bottom electrode; and
      a second variable resistance layer disposed between the second bottom electrode and the second top electrode in the vertical direction, wherein a thickness of the first variable resistance layer is less than a thickness of the second variable resistance layer, and the second variable resistance layer comprises:
      a first layer; and
      a second layer disposed on the first layer, wherein a material composition of the first variable resistance layer is identical to a material composition of at least one of the first layer or the second layer, and the second layer comprises a U-shaped structure surrounding the second top electrode in a cross-sectional view of the second variable resistance layer.

13. The resistive memory device according to claim 12, wherein the material composition of the second layer is different from the material composition of the first variable resistance layer.

14. The resistive memory device according to claim 12, wherein a top surface of the second layer and a top surface of the second top electrode are coplanar.

15. The resistive memory device according to claim 12, wherein the first stacked structure further comprises:
 a first intermediate electrode disposed between the first bottom electrode and the first top electrode in the vertical direction, wherein the first variable resistance layer is disposed between the first intermediate electrode and the first top electrode; and
 a first diode layer disposed between the first intermediate electrode and the first bottom electrode, wherein the second stacked structure further comprises:
 a second intermediate electrode disposed between the second bottom electrode and the second top electrode in the vertical direction, wherein the second variable resistance layer is disposed between the second intermediate electrode and the second top electrode; and
 a second diode layer disposed between the second intermediate electrode and the second bottom electrode.

16. The resistive memory device according to claim 15, wherein a distance between the first top electrode and the first intermediate electrode in the vertical direction is less than a distance between the second top electrode and the second intermediate electrode in the vertical direction.

17. The resistive memory device according to claim 15, wherein the first variable resistance layer directly contacts the first intermediate electrode and the first top electrode, and the second variable resistance layer directly contacts the second intermediate electrode and the second top electrode.

* * * * *